United States Patent
Mukunoki

(10) Patent No.: US 7,333,368 B2
(45) Date of Patent: Feb. 19, 2008

(54) SEMICONDUCTOR MEMORY DEVICE

(75) Inventor: Toshio Mukunoki, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 125 days.

(21) Appl. No.: 11/398,771

(22) Filed: Apr. 6, 2006

(65) Prior Publication Data

US 2006/0250841 A1    Nov. 9, 2006

(30) Foreign Application Priority Data

Apr. 7, 2005    (JP)    ............... 2005-111350

(51) Int. Cl.
*G11C 16/04*    (2006.01)
(52) U.S. Cl. ............... 365/185.24; 365/185.03
(58) Field of Classification Search ........... 365/185.24, 365/185.03, 185.28
See application file for complete search history.

(56) References Cited

U.S. PATENT DOCUMENTS

| | | | |
|---|---|---|---|
| 6,137,718 A | 10/2000 | Reisinger | |
| 6,269,023 B1 * | 7/2001 | Derhacobian et al. | . 365/185.24 |
| 6,456,536 B1 * | 9/2002 | Sobek et al. | ........... 365/185.28 |
| 6,803,299 B2 | 10/2004 | Eitan | |
| 7,184,298 B2 * | 2/2007 | Fazan et al. | ................. 365/149 |

FOREIGN PATENT DOCUMENTS

JP    2002-237191    8/2002

* cited by examiner

*Primary Examiner*—Vu A. Le
(74) *Attorney, Agent, or Firm*—McDermott Will & Emery LLP

(57) ABSTRACT

A semiconductor memory device which is highly reliable, is operable at a low voltage and a high speed, and is produced at a high production yield is provided. A nonvolatile semiconductor memory device capable of reading and erasing data and holding the data even while no voltage is supplied comprises a plurality of memory cells each including a plurality of local charge portions each capable of storing a static charge corresponding to the data. Either two of the local charge portions store the charges in a complementary state.

11 Claims, 14 Drawing Sheets

SEMICONDUCTOR MEMORY DEVICE

BACKGROUND OF THE INVENTION

1. Field of the Invention

The present invention relates to a semiconductor memory device such as, for example, a flash EEPROM (Electronically Erasable and Programmable Read Only Memory) capable of holding data even while no voltage is supplied, and especially to a semiconductor memory device including a multiple bit/cell-type memory cell capable of storing a plurality of pieces of data in one bit such as, for example, an MNOS (Metal Nitride Oxide Semiconductor) memory cell.

2. Description of the Background Art

Semiconductor memory devices having elements integrated on a semiconductor substrate for storing data are roughly classified into volatile semiconductor memory devices capable of holding data only while a voltage is supplied and a nonvolatile semiconductor memory devices capable of holding data even while no voltage is supplied. The semiconductor devices in each category are further classified by systems or uses.

One of the systems used most widely today for the latter category of semiconductor memory devices is a flash EEPROM which is electrically writable and erasable. A type of flash EEPROM which is mainstream today uses a floating memory cell including a MOS (Metal Oxide Semiconductor) transistor and a floating gate provided on a channel of the MOS transistor and insulated by an oxide film or the like. A floating memory cell stores data as follows. When electrons are injected to, or removed from, the floating gate, an electric current starts or stops flowing between the source and the drain of the MOS transistor, and thus the gate voltage threshold (hereinafter, represented as "Vt") is changed.

Recently, MNOS memory cells are again becoming a center of attention. Unlike the floating memory cell, an MNOS memory cell includes an ONO film provided on the channel of the MOS transistor. Vt is changed by injecting electrons or holes into traps in the interface with the ONO film. An MNOS memory cell has a feature that the trapped static charge (electrons or holes) cannot move almost at all. Owing to this feature of the NMOS memory cell, the stored static charge is not all removed even when the oxide film has a defect, unlike in the floating memory cell. Such a feature of the MNOS memory cell is advantageous to solve the problem that data is lost as time passes (retention problem), which is serious today as the oxide film is becoming increasingly thinner.

Also in the MNOS memory cell, the injected static charge can locally stay on the channel because the static charge does not move. In general, the static charge is injected in the vicinity of the drain where hot electrons are generated. Therefore, in the MNOS memory cell, the static charge locally stays on the interface with the ONO film in the vicinity of the drain. Since which side of the NMOS memory cell is the source and which side is the drain is determined by bias conditions, the source and the drain can be exchanged to each other while the semiconductor memory device is being used. Therefore, two areas where the charges locally stay can be formed respectively on two sides of the channel of the MNOS memory cell. By assigning one piece of data to each of these two areas, one MNOS memory cell can store two pieces of data. For these features, expectations for the MNOS memory cells are now increasing.

FIG. 13A is a cross-portional view of a general MNOS memory cell. As shown in FIG. 13A, a LOCOS 101 for device separation, an ONO film 102 and a gate 103 are formed on a semiconductor substrate Sub, and a diffusion layer 104 and a diffusion layer 105 are formed below the LOCOS 101. The gate 103 is generally formed of polysilicon, and is used as a part of a word line in a memory array. The diffusion layer 104 and the diffusion layer 105 act as a drain or a source of the memory cell, and act as a part of buried bit lines in the memory array. Local charge portions 106 and 107 are provided for locally storing charges.

FIG. 13B is a simplified view of the MNOS memory cell shown in FIG. 13A. In FIG. 13B, reference numerals identical to those in FIG. 13A represent elements identical to the elements described above with reference to FIG. 13A. In all the figures attached to this specification, the gate 103, the diffusion layers 104 and 105 (one acts as a drain and the other acts as a source), and the local charge portions 106 and 107 are represented with the reference numerals shown in FIG. 13B.

FIG. 14 is a schematic view of a memory array including conventional memory cells and a peripheral area thereof. FIG. 14 shows a part of the memory array, but an actual array generally includes a great number of memory cells arranged in a direction of rows and a direction of columns. As shown in FIG. 14, a plurality of memory cells M01 through M06 are arranged in an array in the width direction of FIG. 14. A gate of each memory cell is connected to a word line WL0 extending in the width direction and the acting as a common node. Namely, a control gate of the memory cells M01 through M06 is connected to the word line WL0. A source or a drain of each memory cell is connected to one of bit lines BL0 through BL6 extending in the direction perpendicular to the width direction and acting as common nodes. For example, one of the drain and the source of the memory cell M01 is connected to one of the bit lines BL0 and BL1, and the other of the drain and the source of the memory cell M01 is connected to the other of the bit lines BL0 and BL1. Similarly, one of the drain and the source of the memory cell M02 is connected to one of the bit lines BL1 and BL2, and the other of the drain and the source of the memory cell M02 is connected to the other of the bit lines BL1 and BL2.

Each bit line can be selectively connected to one of two inputs of a sense amplifier 209 by a switch 208. The other input of the sense amplifier 209 is connected to a drain of a reference cell R01 via a reference bit line RBL. Used as the reference cell R01 is a CMOS transistor designed such that a current in a middle state between a data state 1 of the memory cell and a data state 0 of the memory cell flows therein. The reference cell R01 is connected to a source line RSL and a word line RWL. A gate of the reference cell R01 is connected to the word line RWL. One of two sides of the reference cell R01, which is not connected to the sense amplifier 209, is a source and is connected to the reference source line RSL.

The conventional memory array shown in FIG. 14 reads data as follows. The current in each of the memory cells M01 through M06 is compared with the current in the reference memory cell R01 to determine the state of the data stored in each memory cell depending on which current is of a higher level. The memory cell, from which the data is to be read, is selected by switching the bit line connected to the sense amplifier 209. The bit line should be selected with care such that the data in the intended one of the two local charge portions 106 and 107 is read without fail.

For example, in order to read a static charge stored in the right local charge portion 107 of the memory cell M02, the bit line BL1 is connected to the sense amplifier 209 and the bit line BL2 is connected to the ground. In order to read a static charge stored in the left local charge portion 106 of the memory cell M02, the bit line BL2 is connected to the sense amplifier 209 and the bit line BL1 is connected to the ground. The bit line connected to the sense amplifier 209 is precharged to a high level immediately before the read. Namely, the direction of the bias voltage of the bit line connected to the memory cell is inverted, and thus the source and the drain are exchanged to switch the local charge portion from which the data is to be read.

Japanese Laid-Open Patent Publication No. 2002-237191 proposes a nonvolatile memory circuit including two floating memory cells for storing a pair of complementary charges. The nonvolatile memory circuit in this publication is described as being capable of reading data at a high speed and with certainty because data is stored as a pair of complementary charges owing to the two memory cells.

In the case of the conventional memory array shown in FIG. 14, the potential of the bit line needs to be high or the current in the reference cell needs to be in the exact middle state between the two data states, in order to have a reading current of a sufficient level for the sense amplifier 209 to determine the state of the data. The former technique is disadvantageous to improving the performance of a semiconductor memory device at a low supply voltage or low power. Specifically, in order to operate a semiconductor memory device at a low supply voltage, the voltage of the bit line needs to be increased using a charge pump, which increases a chip area. The latter technique requires a high precision for the reference cell and a peripheral circuit thereof. This makes the memory cell difficult to design or process-control, and lowers the production yield of the memory cell. In the case of the conventional memory array shown in FIG. 14, the above-mentioned difficulty in obtaining a margin for the reading current means that it is difficult to increase the speed of the reading operation.

The nonvolatile memory circuit described in Japanese Laid-Open Patent Publication No. 2002-237191 requires simply twice the number of memory cells in order to hold one piece of data. This inevitably increases the chip area and lowers the yield.

SUMMARY OF THE INVENTION

Therefore, an object of the present invention is to provide a semiconductor memory device which is highly reliable, is operable at a low voltage and a high speed, and is produced at a high production yield.

The present invention has the following features to attain the object mentioned above. The present invention is directed to a nonvolatile semiconductor memory device capable of reading and erasing data and holding the data even while no voltage is supplied, comprising a plurality of memory cells each including a plurality of local charge portions each capable of storing a static charge corresponding to the data. Either two of the local charge portions store the charges in a complementary state.

According to the above-described structure, charges in a complementary state are stored in two local charge portions to store data. Therefore, a margin of the reading current can be increased, and the semiconductor memory device can be operated at a low voltage and a high speed. Since the operation for reading data does not require a reference cell, the production yield of the memory chip can be improved.

Preferably, the two local charge portions are included in different memory cells. Preferably, the two local charge portions are included in the same memory cell.

Preferably, the charges stored in the complementary state are read using different bit lines respectively connected to the local charge portions.

Preferably, the charges stored in the complementary state are read using a dummy bit line which is not connected to the local charge portions. According to the above-described structure, a stable read operation is provided.

Preferably, the two local charge portions are included in different memory cells included in different memory arrays. According to the above-described structure, a stable read operation is provided.

Preferably, the two local charge portions are included in different memory cells connected to different word lines. According to the above-described structure, the reference cell is not necessary for write verification, and the write verification is performed using a relative Vt difference between the memory cells, which corresponds to the relative Vt difference at the time of data read. Therefore, the write verification can be performed more accurately.

Preferably, the semiconductor memory device further comprises capacitors connected to bit lines for reading the charges stored in the complementary state via a switch. According to the above-described structure, all the memory cells can have the same charge storage state regardless of the type of data written thereto. This guarantees a high reliability.

Preferably, the local charge portions are switchable into a state of storing charges independently. Preferably, the local charge portions are switched based on a flag. According to the above-described structure, especially according to the structure by which the local charge portions are switchable into a state of storing charges independently, the data storage method can be switched in accordance with the situation of usage. Therefore, the memory area can be used more efficiently.

Preferably, one bit of data is stored using a plurality of pairs of the local charge portions, each pair being capable of storing the charges in the complementary state. According to the above-described structure, the operation speed and the reliability of the semiconductor memory device can be improved.

The present invention provides a semiconductor memory device which is highly reliable, operable at a low voltage and a high speed, and is produced at a high production yield.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
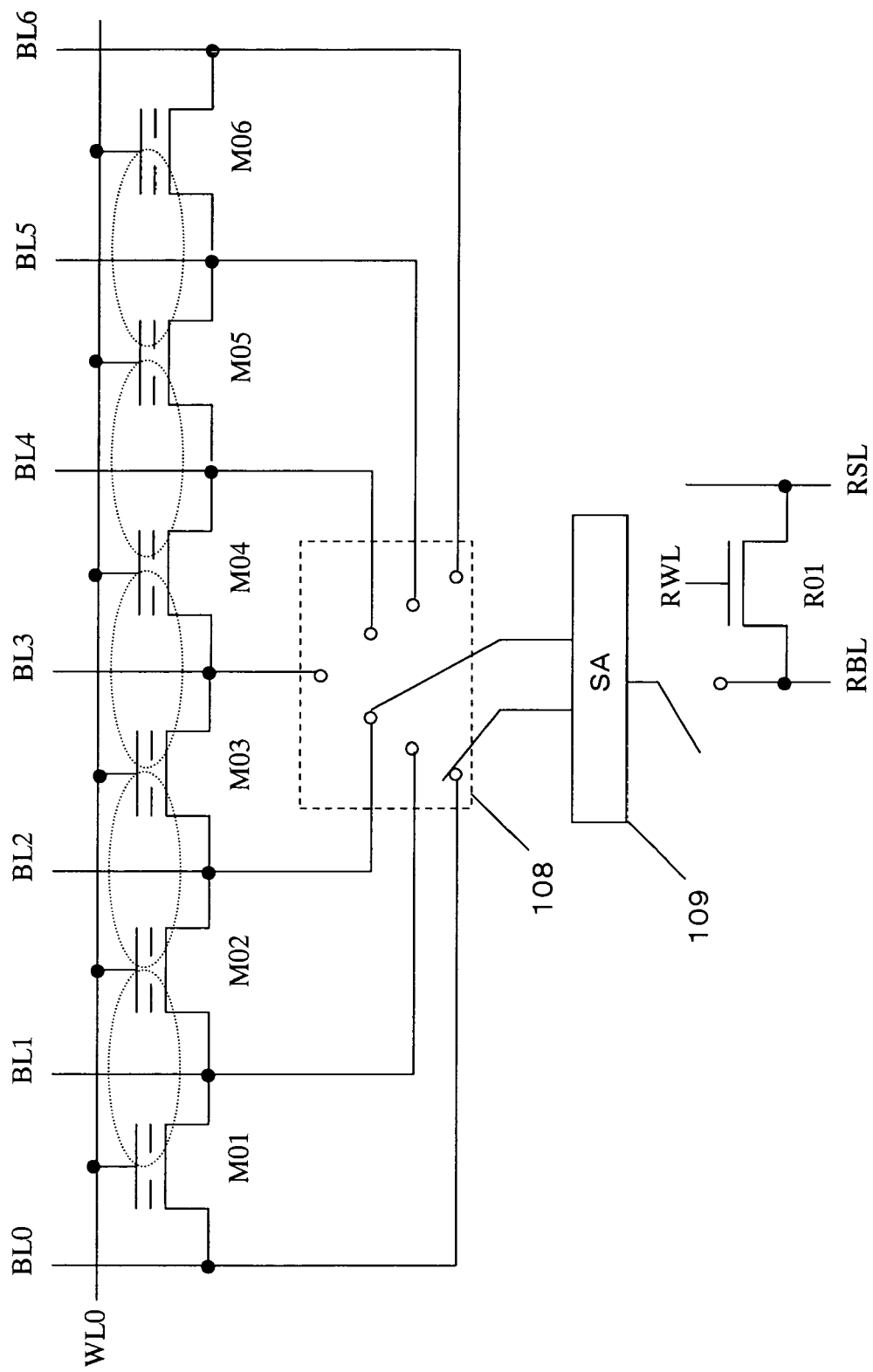
FIG. 1 is a schematic view of a memory array and a peripheral area thereof included in a semiconductor memory device according to a first embodiment of the present invention.
Figure 14:
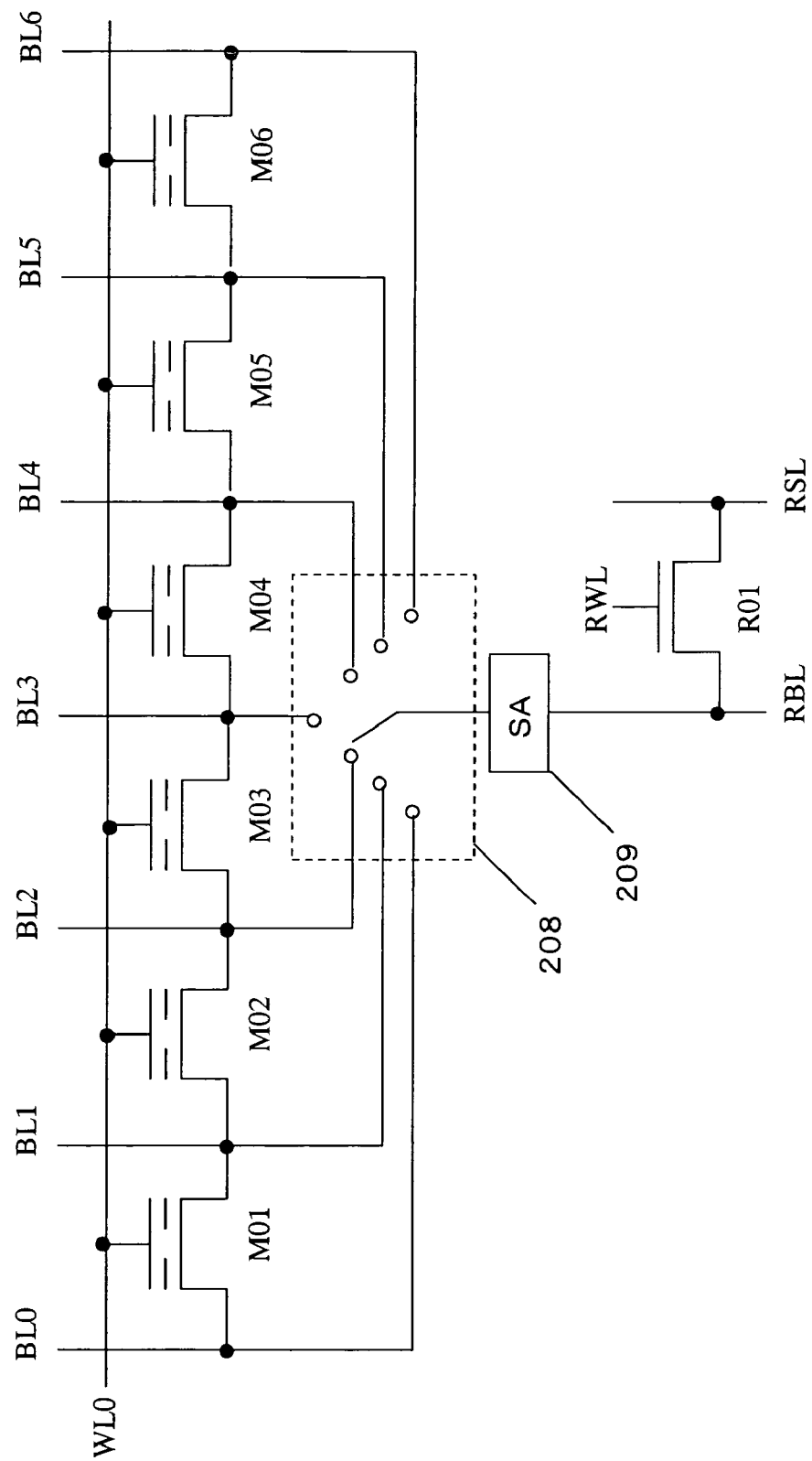
FIG. 14 is a schematic view of a memory array and a peripheral area thereof including conventional memory cells.

FIG. 1 is a schematic view of a memory array and a peripheral area thereof included in a semiconductor memory device according to a first embodiment of the present invention. Like the conventional memory array described above with reference to FIG. 14, the semiconductor memory device in the first embodiment mainly includes a plurality of memory cells M01 through M06. The plurality of memory cells M01 through M06 are arranged in an array in the width direction of FIG. 1. A gate of each memory cell is connected to a word line WL0 extending in the width direction and acting as a common node. Namely, a control gate of the memory cells M01 through M06 is connected to the word line WL0. A source or a drain of each memory cell is connected to one of bit lines BL0 through BL1 extending in the direction perpendicular to the width direction and acting as common nodes. For example, one of the drain and the source of the memory cell M01 is connected to one of the bit lines BL0 and BL1, and the other of the drain and the source of the memory cell M01 is connected to the other of the bit lines BL0 and BL1. One of the drain and the source of the memory cell M02 is connected to one of the bit lines BL1 and BL2, and the other of the drain and the source of the memory cell M02 is connected to the other of the bit lines BL1 and BL2.

In the semiconductor memory device in the first embodiment, a sense amplifier 109 includes three inputs. Two inputs of the sense amplifier 109 are respectively connected to bit lines via a switch 108. These two inputs are connected to bit lines which have one bit line interposed therebetween and are not immediately adjacent to each other. In the example of FIG. 1, the bit line BL0 and the bit line BL2 are concurrently connected to the two inputs of the sense amplifier 109. The other input of the sense amplifier 109 is connected to the reference bit line RBL, which is connected to a drain of a reference cell R01, via a selector switch.

As the reference cell R01, a CMOS transistor is generally used. The reference cell R01 is connected to a source line RSL and a word line RWL. A gate of the reference cell R01 is connected to the word line RWL. One of two sides of the reference cell R01, which is not connected to the sense amplifier 109, is a source and is connected to the reference source line RSL.

Unlike in the conventional memory array described above with reference to FIG. 14, in the semiconductor memory device in the first embodiment, the reference cell R01 is not used for reading data stored in the memory cells. The reference cell R01 operates only for write verification and erasure verification. The "write verification" means to check the Vt level at the time of data write in order to check whether the data has been accurately stored in a memory cell or not. The "erasure verification" means to check the Vt level at the time of data erasure in order to check whether the data has been accurately erased from a memory cell or not. The reference cell R01 is connected to the sense amplifier 109 by a switch connected to the reference bit line RBL to operate at the time of the write verification and the erasure verification.

In the semiconductor memory device in the first embodiment, two adjacent local charge portions respectively included in two adjacent one memory cells connected to a common bit line (the local charge portions in each of the dotted circles in FIG. 1) are paired with each other to store two charges in a complementary state. The complementary state will be described regarding, for example, the right local charge portion 107 of the memory cell M01 and the left local charge portion 106 of the memory cell M02. For example, when electrons are injected into the right local charge portion 107 of the memory cell M01, holes are injected into the left local charge portion 106 of the memory cell M02. By contrast, when holes are injected into the right local charge portion 107 of the memory cell M01, electrons are injected into the left local charge portion 106 of the memory cell M02. Namely, the complementary state means a state where charges of opposite polarities are injected into paired local charge portions and stored therein.

The semiconductor memory device in the first embodiment injects charges of opposite polarities into paired local charge portions, and thus respectively assign data 0 and data 1 to the paired local charge portions to store data. Since the static charges corresponding to data are stored in the paired local charge portions in the complementary state, the reference cell R01 is not necessary for reading data. Data can be read by comparing two local charge portions in a complementary state with each other. This is why the reference cell R01 operates only for write verification and erasure verification.

Since the reference cell R01 is not operated for reading data, the margin for the reading current can be increased. For reading data, a conventional semiconductor memory device requires comparing the state in which electrons or holes are stored in the local charge portion 106 or 107 with the middle state between the two states of the reference cell R01 because of the operating principle thereof. By contrast, the semiconductor memory device in the first embodiment compares, for example, the state in which electrons are stored in the local charge portion 106 and the state in which holes are stored in the local charge portion 107. Therefore, the margin for the reading current can be doubled.

Since the reading current can be doubled, an operation at a low voltage is possible, and the voltage of the bit line does not need to be increased due to the shortage of the reading current. The doubled reading current can also increase the operating speed.

Since the reference cell R01 is not necessary for reading data, the difficulty in forming the reference cell R01 at the time of production is reduced and the production yield of the memory chip can be improved. Instead of injecting holes of one of the paired local charge portions, a state in which there is no electrons may be formed. In this case, a complementary state is realized with this state and the state of the other local charge portion in which the electrons are injected. The memory cells including the paired local charge portions do not need to be adjacent to each other. Memory cells connected to different word lines or bit lines, or memory cells in different array blocks, may provide a pair of local charge portions. It is also possible to use a plurality of pairs of local charge portions to store one piece of data, so that the reading results can be determined in accordance with majority basis or a sum of the reading currents can be obtained. With such a structure, a semiconductor memory device which is more reliable and has a larger operating margin can be realized.

Figure 2:
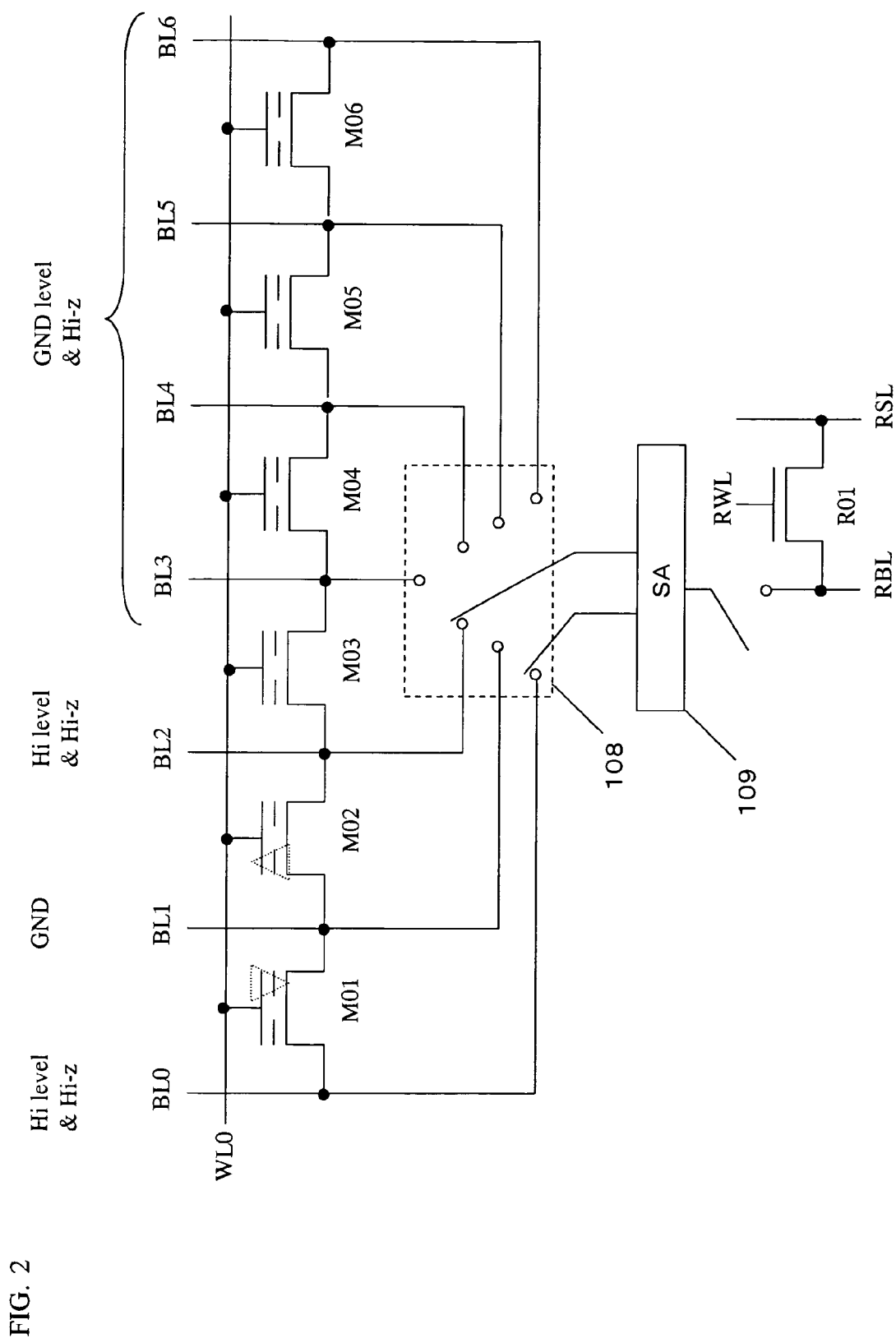
FIG. 2 is a schematic view illustrating a reading operation of the semiconductor memory device according to the first embodiment of the present invention.

FIG. 2 is a schematic view illustrating a reading operation of the semiconductor memory device in the first embodiment. With reference to FIG. 2, an operation for reading data stored in a pair of the right local charge portion 107 of the memory cell M01 and the left local charge portion 106 of the memory cell M02 will be described. In FIG. 2, a dotted-lined triangle projecting downward shows that holes are injected into the right local charge portion 107 of the memory cell M01, and a dotted-lined triangle projecting upward shows that electrons are injected into the left local charge portion 106 of the memory cell M02. In FIG. 2, the bias voltage states of the bit lines immediately before the reading operation starts are shown above the corresponding bit lines. Hereinafter, the reading operation will be sequentially described.

In an initial state, all the nodes are at the ground level GND. First, the bit lines BL3 through BL6 are placed into a high impedance state Hi-z, and the bit lines BL1 is connected to the ground GND. Next, the bit lines BL0 and BL2 are precharged to a Hi (high) level and then placed into the high impedance state Hi-z. By setting the above bias conditions, the Vt of the memory cell M01 is lowered because holes exist in the right local charge portion 107 which is to act as a source. By contrast, the Vt of the memory cell M02 is raised because electrons exist in the left local charge portion 106 which is to act as a source.

Accordingly, when the word line WL0 is opened, the potential of the bit line BL0 is lowered due to the cell current flowing in the memory cell M01, whereas the potential of the bit line BL2 is not lowered because almost no cell current flows in the memory cell M02. In order to detect a potential difference between the bit lines BL0 and BL2, the sense amplifier 109 is connected to the bit lines BL0 and BL2 using the switch 108 and is started to conduct differential amplification.

At this point, the reference bit line RBL on the reference cell side is kept separated from the sense amplifier 109 by the selector switch in the sense amplifier 109. By the above-described operation, data stored in the pair of the right local charge portion 107 of the memory cell M01 and the left local charge portion 106 of the memory cell M02 can be read. The word line WL0 may be opened after the sense amplifier 109 is connected to the bit lines BL0 and BL2. This procedure may optimize the starting timing of the sense amplifier 109 more easily.

Figure 3A:
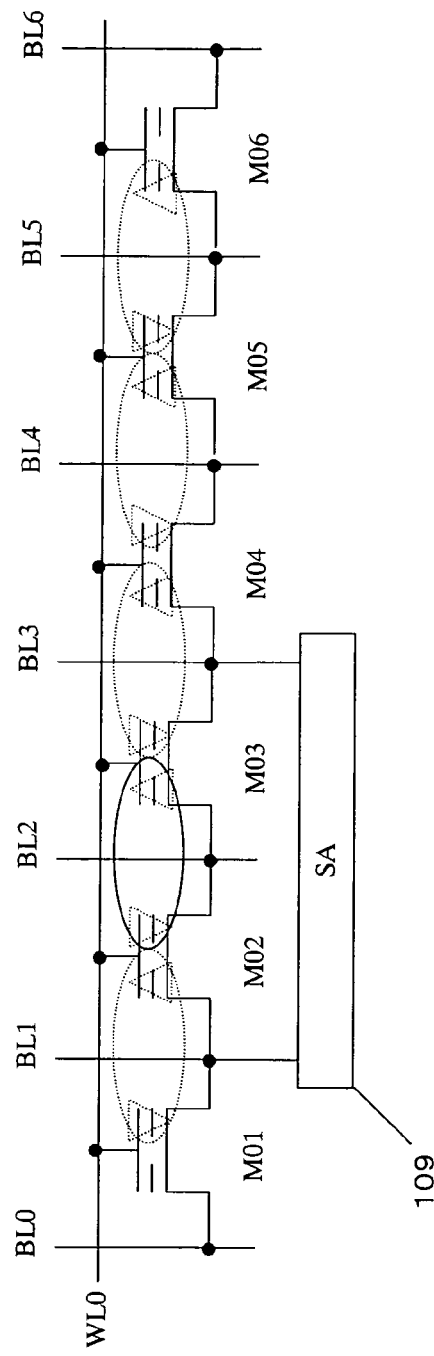
FIG. 3A and FIG. 3B are schematic views illustrating a connection state of a sense amplifier when addresses transit in the column direction in the semiconductor memory device according to the first embodiment.
Figure 3B:
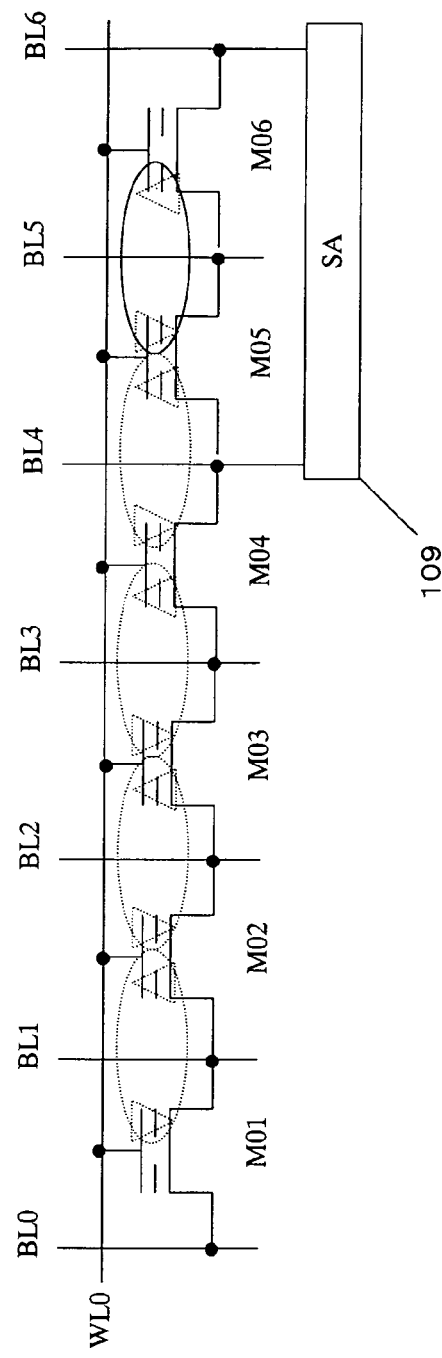

FIG. 3A and FIG. 3B are each a schematic view illustrating a connection state of the sense amplifier 109 when addresses transit in the column direction in the semiconductor memory device in the first embodiment. The elements around the sense amplifier 109 are partially omitted due to the shortage of space on the sheet of FIG. 3A and FIG. 3B. FIG. 3A shows a connection state of the sense amplifier 109 for reading data stored in the pair of the right local charge portion 107 of the memory cell M02 and the left local charge portion 106 of the memory cell M03. In this case, as shown in FIG. 3A, the sense amplifier 109 is connected to the bit line BL1 and the bit line BL3.

FIG. 3B shows a connection state of the sense amplifier 109 for reading data stored in the pair of the right local charge portion 107 of the memory cell M05 and the left local charge portion 106 of the memory cell M06. In this case, as shown in FIG. 3B, the sense amplifier 109 is connected to the bit line BL4 and the bit line BL6. The connection state in FIG. 3A is switched the state in FIG. 3B by changing the connection between the sense amplifier 109 and the bit lines by the switch 108.

A method for writing data to, and erasing data from, the semiconductor memory device in the first embodiment will be described. The method will be described in the order of prewrite, erasure, and write in compliance with the actual data rewrite procedure. The "prewrite" means to inject electrons to a local charge portion having no electrons before data erasure. This is conducted in order to prevent reliability deterioration or the like which may be otherwise caused by continuously erasing data.

Figure 4A:
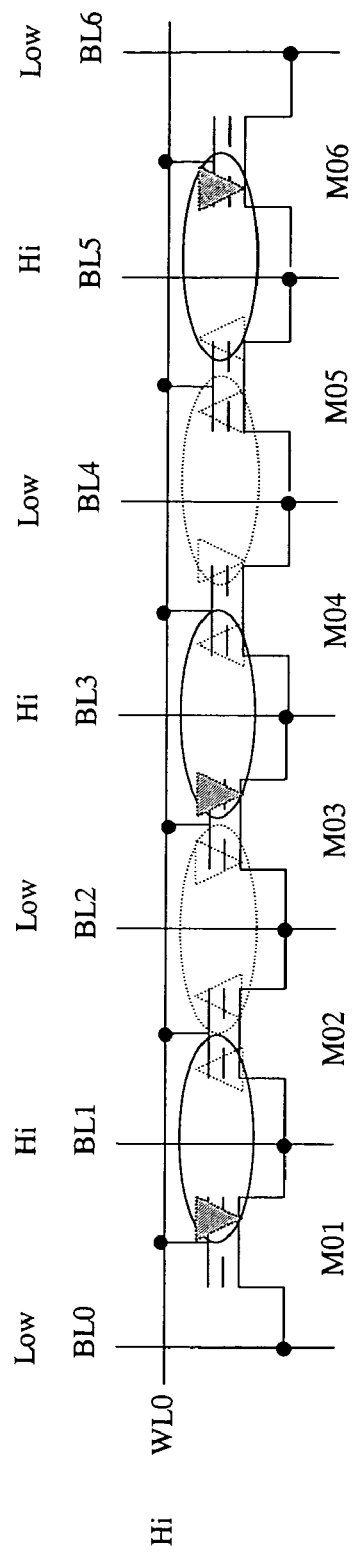
FIG. 4A and FIG. 4B are schematic views illustrating bias conditions for prewrite in the semiconductor memory device according to the first embodiment.
Figure 4B:
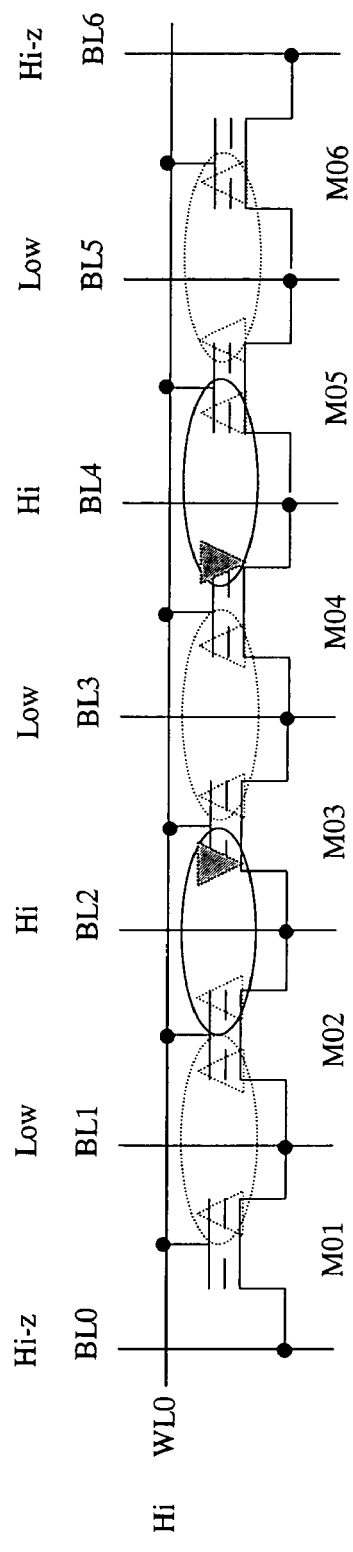

FIG. 4A and FIG. 4B are schematic views illustrating bias conditions for prewrite. The elements around the sense amplifier 109 are partially omitted due to the shortage of space on the sheet of FIG. 4A and FIG. 4B.

FIG. 4A shows bias conditions for injecting electrons into local charge portions adjacent to odd numbered bit lines. As shown in FIG. 4A, the odd numbered bit lines such as the bit lines BL1 and BL3 are put to the Hi (high) level. By such bias conditions, electrons are injected into the local charge portion 107 of the memory cell M01, the local charge portion 107 of the memory cell M03 and the like, which are connected to the odd numbered bit lines. In FIG. 4A, the local charge portions into which the electrons are injected are represented with hatched triangles projecting downward.

FIG. 4B shows bias conditions for injecting electrons into local charge portions adjacent to even numbered bit lines. After the procedure shown in FIG. 4B, as shown in FIG. 4B, the odd numbered bit lines such as the bit lines BL1 and BL3 are put to a low (Low) level and the even numbered bit lines such as the bit lines BL0 and BL2 are put to the high (Hi) level. By such bias conditions, electrons are injected into the local charge portion 106 of the memory cell M03, the local charge portion 107 of the memory cell M04 and the like, which are connected to the even numbered bit lines. In FIG. 4B, the local charge portions into which the electrons are injected are represented with hatched triangles projecting downward. In this manner, local charge portions having no electrons are supplied with electrons before data erasure. The prewrite is performed alternately to the two local charge portions in each cell.

Figure 5:
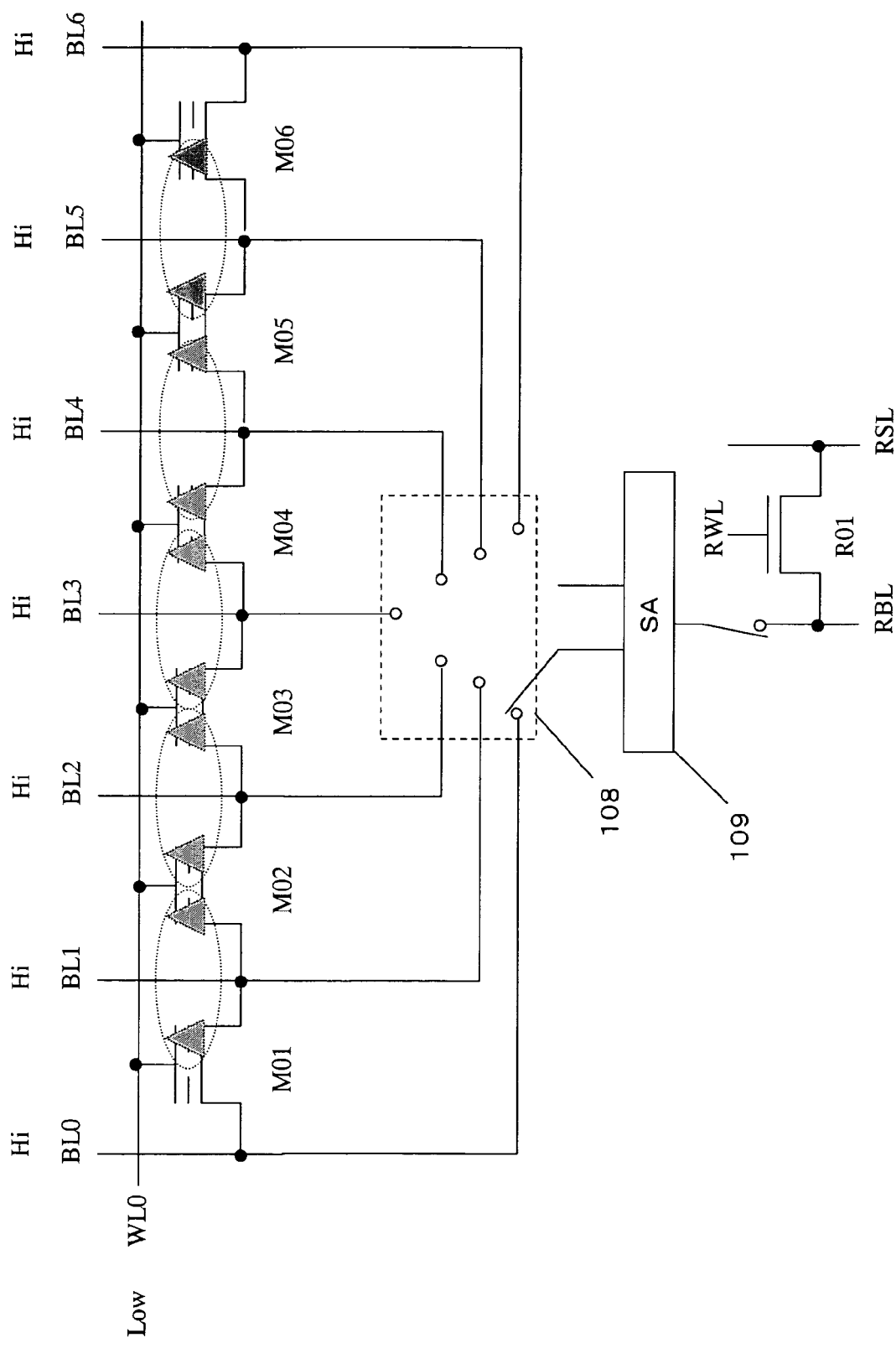
FIG. 5 is a schematic view illustrating bias conditions for erasing data in the semiconductor memory device according to the first embodiment.

FIG. 5 is a schematic view illustrating bias conditions for erasing data from the memory cells in the semiconductor memory device in the first embodiment. As shown in FIG. 5, for erasing data, holes are injected concurrently into all the local charge portions to neutralize the electrons stored therein. In order to use the state in which the holes are stored in a local charge portion in order to store data, holes are additionally injected.

Next, it is checked whether or not the data has been erased by erasure verification. The erasure verification is performed using the reference cell R01. For example, for performing the erasure verification regarding the right local charge portion 107 of the memory cell M01, the bit line BL0 is connected to the sense amplifier 109 using the switch 108, and the reading operation is performed using the reference cell R01. When data having an expected value is read, it is confirmed that the data has been erased. In general, for erasure verification, the potentials of the word line WL0 and the reference word line RWL are adjusted such that it is confirmed that the memory cell of interest is at a desired level of Vt. Erasure verification may also be performed by other methods.

Figure 6:
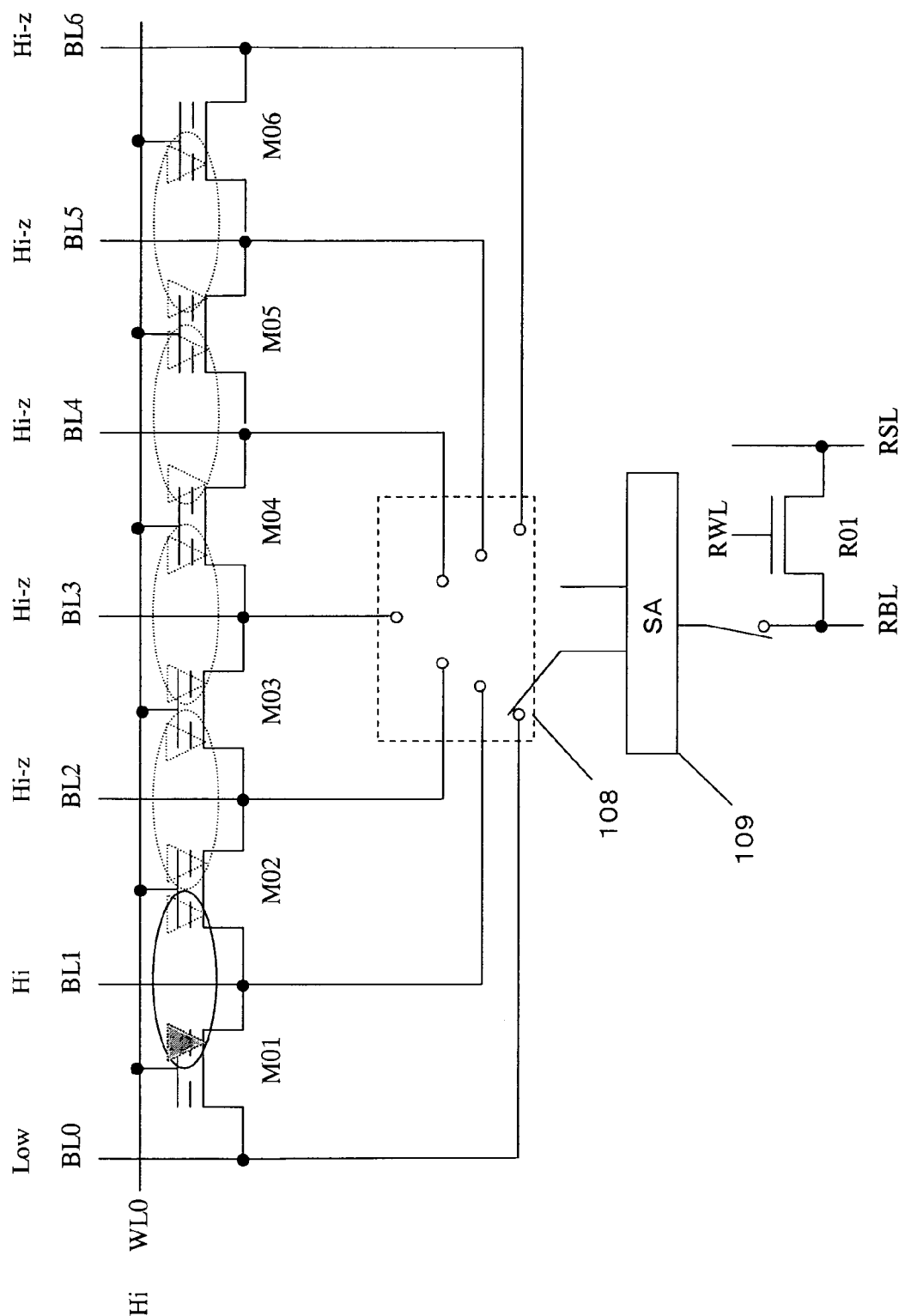
FIG. 6 is a schematic view illustrating bias conditions for writing data in the semiconductor memory device according to the first embodiment.

FIG. 6 is a schematic view illustrating bias conditions for writing data to the memory cells in the semiconductor memory device in the first embodiment. FIG. 6 shows the bias conditions for writing data to the pair of the right local charge portion 107 of the memory cell M01 and the left local charge portion 106 of the memory cell M02.

As shown in FIG. 6, for writing data to the above-mentioned local charge portions, the bit line BL0 is put to the low (Low) level, the bit line BL1 is put to the high (Hi) level, and the other bit lines BL2 through BL6 are placed into the high impedance state Hi-z. By this state, electrons are injected into the right local charge portion 107 of the memory cell M01.

Next, it is checked whether or not the data has been written by write verification. The write verification is performed using the reference cell R01. For example, for performing the write verification regarding the right local charge portion 107 of the memory cell M01, the bit line BL0 is connected to the sense amplifier 109 using the switch 108, and the reading operation is performed using the reference cell R01. When data having an expected value is read, it is confirmed that the data has been written. In general, for write verification, the potentials of the word line WL0 and the reference word line RWL are adjusted such that it is confirmed that the memory cell of interest is at a desired level of Vt. Write verification may also be performed by other methods.

As described above, the semiconductor memory device in the first embodiment stores data by storing charges in two local charge portions in the complementary state. Therefore, the margin for the reading current can be increased, and the operation can be performed at a low voltage and a high speed. Since the reference cell is not needed for reading data, the production yield of the memory chip can be improved.

Second Embodiment

Figure 7:
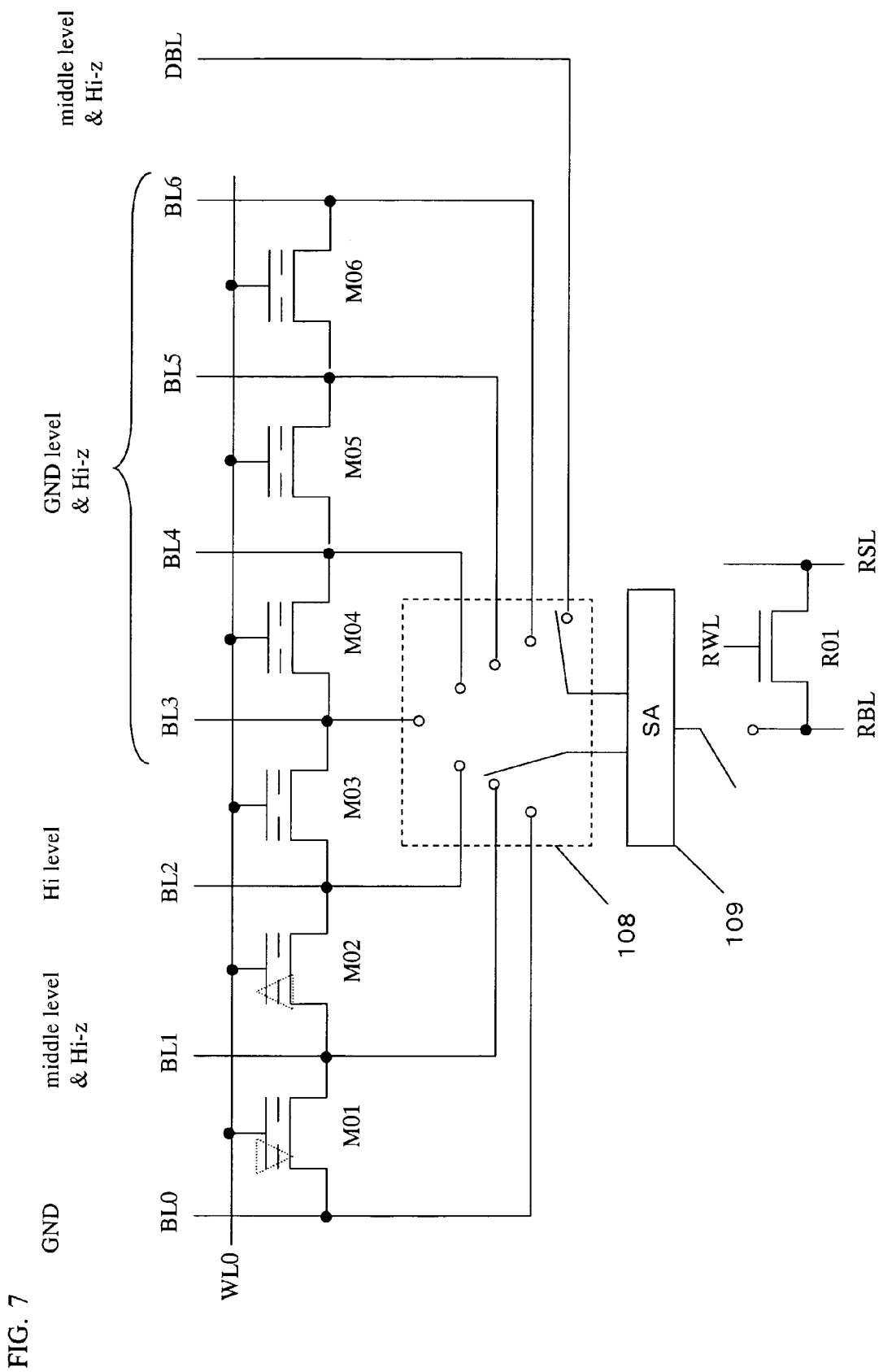
FIG. 7 is a schematic view of a memory array and a peripheral area thereof included in a semiconductor memory device according to a second embodiment of the present invention.

FIG. 7 is a schematic view of a memory array and a peripheral area thereof included in a semiconductor memory device according to a second embodiment of the present invention. Since the semiconductor memory device in the second embodiment is similar to the semiconductor memory device in the first embodiment shown in FIG. 2, and will be described mainly regarding the differences from the first embodiment.

Unlike in the first embodiment, the semiconductor memory device in the second embodiment includes a dummy bit line DBL, and one of the inputs of the sense amplifier 109 is connected to the dummy bit line DBL. The bias conditions regarding the bit lines for the reading operation are also different from those of the first embodiment. Hereinafter, an operation for reading data stored in the pair of the right local charge portion 106 of the memory cell M01 and the left local charge portion 107 of the memory cell M02 will be described.

In an initial state, all the nodes are at the ground level GND. First, the bit lines BL3 through BL6 are placed into a high impedance state Hi-z, the bit line BL0 is connected to the ground GND, and the bit line BL2 is put to a high (Hi) level. Next, the bit line BL1 is precharged to a middle level between the ground level and the high (Hi) level, and simultaneously the dummy bit line DBL is also precharged to the middle level.

In the second embodiment, it is important that the bit line BL1 and the dummy bit line DBL should be precharged to an equal middle level in order to stably read data. Therefore, it is desirable to electrically connect the bit line BL1 and the dummy line DBL to each other using a switch or the like.

After the precharge operation is finished, the precharge power supply is disconnected. Then, the switch or the like connecting the bit line BL1 and the dummy bit line DBL is turned off, and the bit line BL1 and the dummy bit line DBL are placed into the high impedance state Hi-z. As a result, the bias conditions shown in FIG. 7 are realized. By setting the above bias conditions, the Vt of the memory cell M01 is lowered because holes exist in the left local charge portion 106 which is to act a source and the Vt of the memory cell M02 is raised because electrons exist in the left local charge portion 106 which is to act a source. When the word line WL0 is opened, the level of the current flowing in the memory cell M01 is higher than the level of the current flowing in the memory cell M02. Therefore, the potential of the bit line BL1 is lowered from the middle level to the ground level. By comparing this level with the level of the potential of the dummy bit line DBL, data can be read.

As described above, the semiconductor memory device in the second embodiment includes the dummy bit line DBL. Therefore, the bit line into which the data is read is not influenced by other bit lines into which data is not read. Thus, the reading operation can be performed more stably.

Third Embodiment

Figure 8:
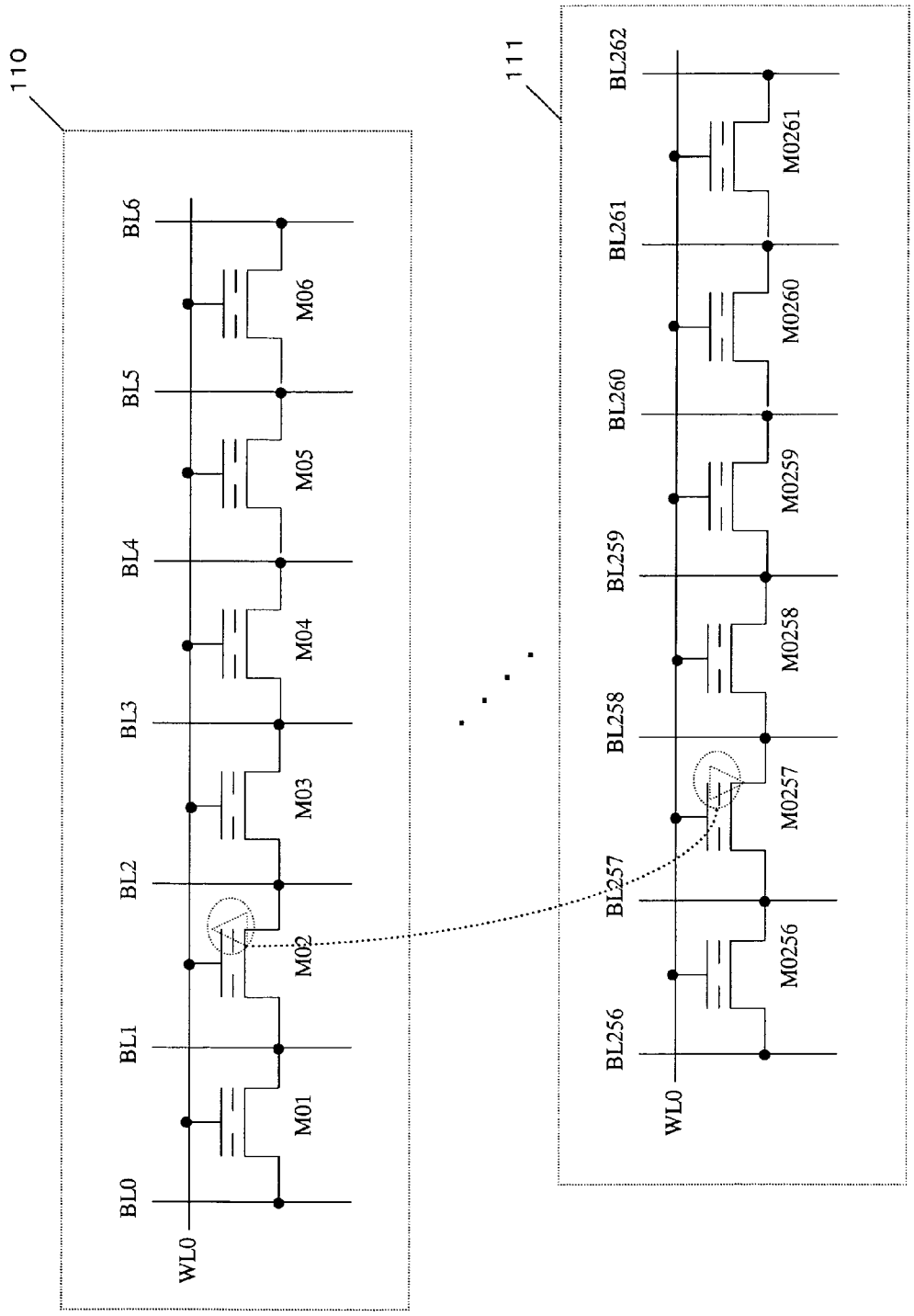
FIG. 8 is a schematic view of a memory array and a peripheral area thereof included in a semiconductor memory device according to a third embodiment of the present invention.

FIG. 8 is a schematic view of a memory array and a peripheral area thereof included in a semiconductor memory device according to a third embodiment of the present invention. Since the general structure of the semiconductor memory device in the third embodiment is similar to that of the semiconductor memory device in the first embodiment shown in FIG. 2, the second embodiment will be described mainly regarding the differences from the first embodiment.

The semiconductor memory device in the third embodiment is different from the first embodiment in that local charge portions which are paired are included in different memory array blocks. A "memory array block" is a unit including a plurality of memory cells. As shown in FIG. 8, the semiconductor memory device in the third embodiment includes a memory array block 110 and a memory array block 111.

In general, bit lines included in one, same memory array block, for example, the bit lines B0 through B6, are connected to each other via memory cells. Bit lines included in different memory array blocks are not connected to each other. For example, in the case of the third embodiment, the bit line BL6 is not connected to a bit line BL256. Word lines included in different memory array blocks may not occasionally be connected to each other, but the semiconductor memory device in the third embodiment has word lines common to different memory array blocks, for example, the word line WL0.

Although not shown in FIG. 8, the memory array block 110 and the memory array block 111 each have an array structure having a plurality of word lines. Local charge portions to be paired can be arbitrarily combined between different memory array blocks. It is desirable to combine two local charge portions located at the same position in the each memory array block, for example, the right local charge portion 107 of the memory cell M02 in the memory array block 110 and the right local charge portion 107 of a memory M0257 in the memory array block 111.

The reading operation performed in the semiconductor memory device in the third embodiment is substantially the same as that of the first embodiment described above with reference to FIG. 2, except that data is read into bit lines included in different memory array blocks, for example, the bit line BL1 and a bit line BL257, and thus will not be described here.

As described above, the semiconductor memory device in the third embodiment can store charges in the complementary state in a pair of local charge portions in different memory array blocks. Owing to such a system, the bit lines connected to a pair of local charge portions from which data is read are substantially in the same state. Therefore, the influence exerted on the pair of local charge portions by other bit lines, into which no data is read, can be substantially the same. As a result, the influence equally exerted on the pair of local charge portions by the differential amplification performed by the sense amplifier can be cancelled. Thus, the reading operation can be performed more stably.

Fourth Embodiment

Figure 9:
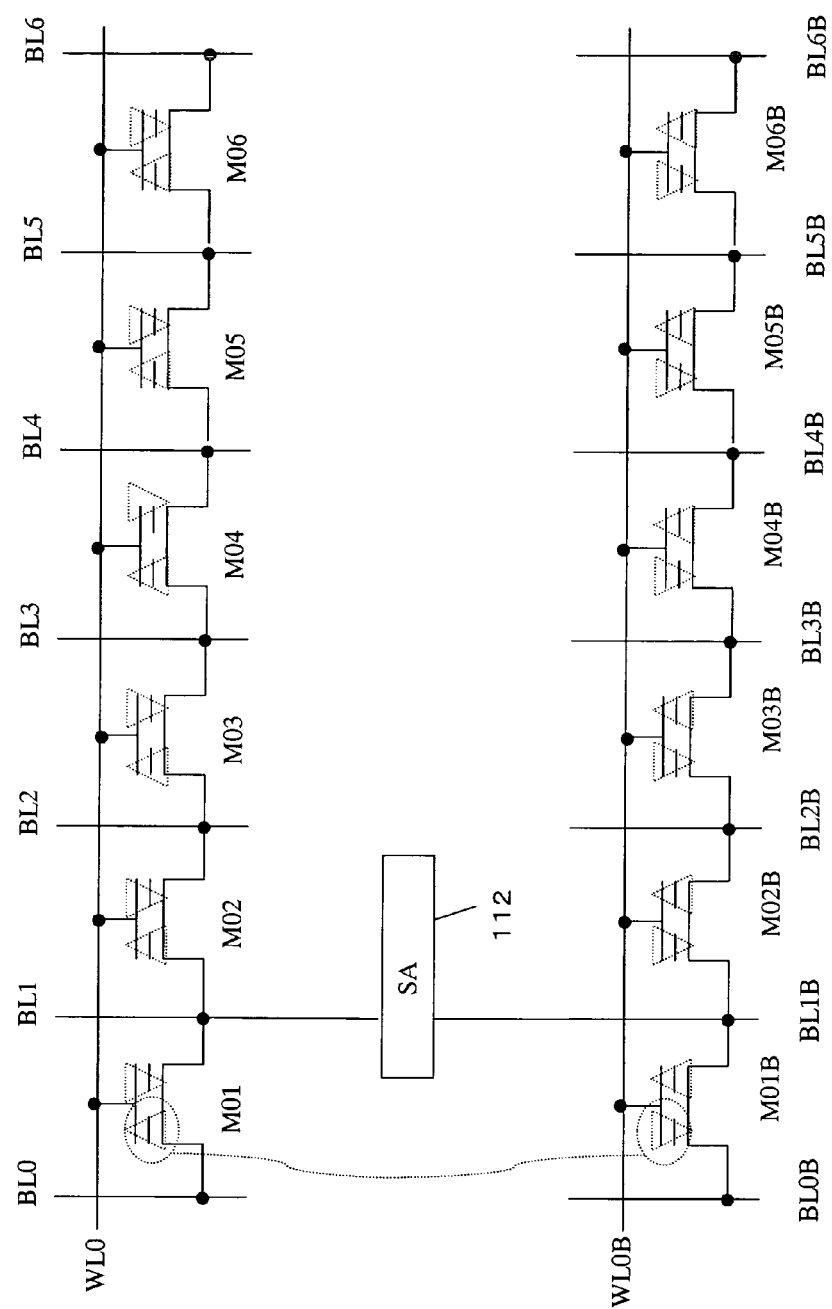
FIG. 9 is a schematic view of a memory array and a peripheral area thereof included in a semiconductor memory device according to a fourth embodiment of the present invention.

FIG. 9 is a schematic view of a memory array and a peripheral area thereof included in a semiconductor memory device according to a fourth embodiment of the present invention. Since the general structure of the semiconductor memory device in the fourth embodiment is similar to that of the semiconductor memory device in the fourth embodiment shown in FIG. 2, the third embodiment will be described mainly regarding the differences from the first embodiment.

The semiconductor memory device in the fourth embodiment is different from the first embodiment in that local charge portions which are paired are included in different memory array blocks between which neither bit lines nor word lines are connected. For example, in the case where the left local charge portions 106 of the memory cells M01 and M01B, data is read into bit lines BL1 and BL1B. The bit lines BL1 and BL1B are commonly connected to a sense amplifier 112.

The semiconductor memory device in the fourth embodiment has a feature in the operation for write verification. For the write verification, the conditions on the potential between the word lines WL0 and WL0B connected to the memory cells including the paired local charge portions are set to be stricter than those of the reading operation.

Specifically, the write verification is performed as follows. For injecting electrons into, for example, the left local charge portion 106 of the memory cell M01, the potential of the word line WL0 is set to be higher than that of the word line WL0B such that the current flows easily in the memory cell M01. In this state, the data (potential) read into the bit line BL1 is compared with the data (potential) read into the bit line BL1B from the memory cell M01B using the sense amplifier 112. It is checked whether data having an expected value is read or not.

As described above, the semiconductor memory device in the fourth embodiment does not require a reference cell for the write verification. In addition, the semiconductor memory device in the fourth embodiment performs the write verification using a relative Vt difference between the memory cells, which corresponds to the relative Vt difference at the time of data read. Therefore, the write verification can be performed more accurately.

Fifth Embodiment

Figure 10A:
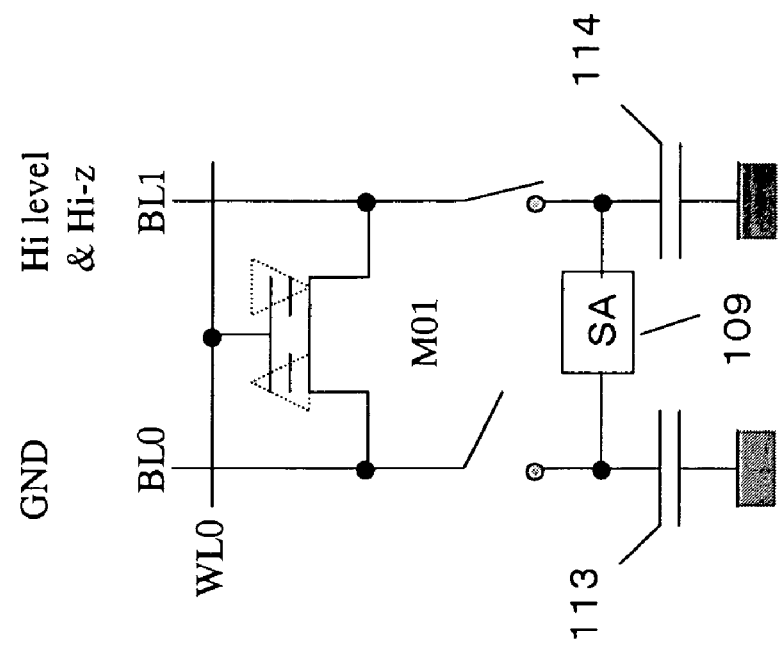
FIG. 10A and FIG. 10B are schematic views illustrating bias conditions for a memory cell included in a semiconductor memory device according to a fifth embodiment of the present invention.
Figure 10B:
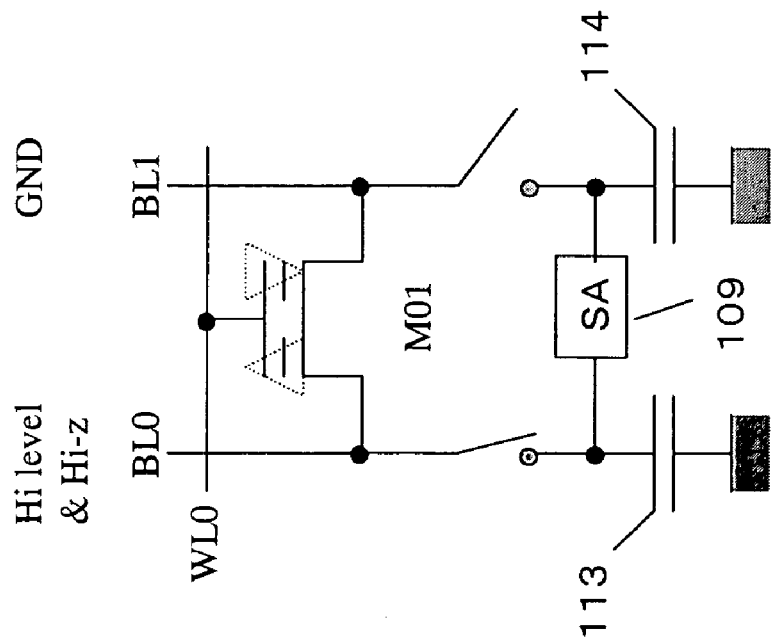

FIG. 10A and FIG. 10B are schematic views illustrating bias conditions for a memory cell included in a semiconductor memory device according to a fifth embodiment of the present invention. The semiconductor memory device according to the fifth embodiment has a feature that local charge portions included in one, same memory cell are paired. Since the general structure of the semiconductor memory device in the fifth embodiment is similar to that of the semiconductor memory device in the first embodiment shown in FIG. 2, the fifth embodiment will be described mainly regarding the differences from the first embodiment. FIG. 10A shows bias conditions for reading data (charge) stored in the right local charge portion 107 of the memory cell M01, and FIG. 10B shows bias conditions for reading data (charge) stored in the left local charge portion 106 of the memory cell M01.

One end of the bit line BL0 connected to the memory cell M01 is connected to the ground via a capacitor 113, and one end of the bit line BL1 also connected to the memory cell M01 is connected to the ground via a capacitor 114. The capacitors 113 and 114 each have a function of temporarily holding a potential of the respective bit line. The bit lines BL0 and BL1 can be each connected to the sense amplifier 109 via a switch.

Hereinafter, a procedure for reading data in the semiconductor memory device in the fifth embodiment will be described. First, the bit line BL0, among the bit lines at the ground level GND, is precharged to a high (Hi) level. After the precharge operation is finished, the precharge power supply is disconnected, and the bit line BL0 is placed into a high impedance state Hi-z. These are the bias conditions shown in FIG. 10A. With such bias conditions, the word line WL0 is opened, the state in the right local charge portion 107 of the memory cell M01 is read into the bit line BL0 and transferred to the capacitor 113 in the form of a potential, and the bit line BL0 is disconnected.

Next, the bit lines are returned to the ground level GND, and then the bit line BL1 is precharged to the high (Hi) level. After the precharge operation is finished, the precharge power supply is disconnected, and the bit line BL1 is placed into the high impedance state Hi-z. These are the bias conditions shown in FIG. 10B. With such bias conditions, the word line WL0 is opened, the state in the left local charge portion 106 of the memory cell M01 is read into the bit line BL1 and transferred to the capacitor 114 in the form of a potential, and the bit line BL1 is disconnected.

In the state where the bit lines BL0 and BL1 are disconnected from the sense amplifier 109, the potential difference between the capacitors 113 and 114 is amplified by the sense amplifier 109. Thus, the data (charges) stored in the memory cell M01 in the complementary state can be read.

In the semiconductor memory device in the fifth embodiment having the above-described structure, all the memory cells have the same charge storage state regardless of the type of data written thereto. This guarantees a high reliability.

Sixth Embodiment

Figure 11:
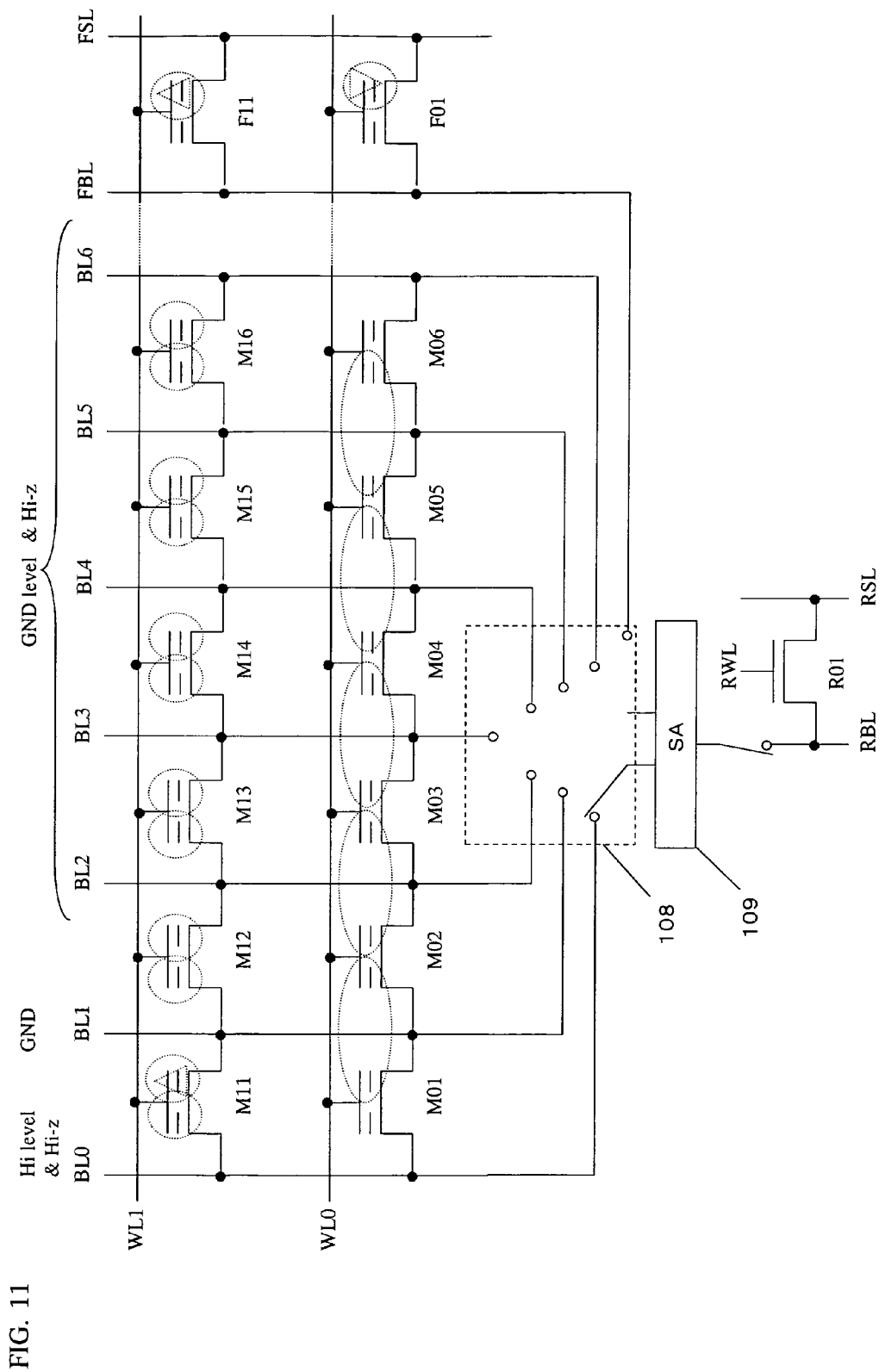
FIG. 11 is a schematic view of a memory array and a peripheral area thereof included in a semiconductor memory device according to a sixth embodiment of the present invention.

FIG. 11 is a schematic view of a memory array and a peripheral area thereof included in a semiconductor memory device according to a sixth embodiment of the present invention. Since the general structure of the semiconductor memory device in the sixth embodiment is similar to that of the semiconductor memory device in the first embodiment shown in FIG. 2, the sixth embodiment will be described mainly regarding the differences from the first embodiment.

FIG. 11 shows memory cells M11 through M16 and a word line WL1 which are omitted from FIG. 2 which shows the semiconductor memory device in the first embodiment. Unlike in the first embodiment, the semiconductor memory device in the fifth embodiment includes flag cells F01 and F11, a source line FSL for the flag cells and a bit line FBL for the flag cells. The flag cells F01 and F11 are MNOS memory cells like the memory cell M01 and the like.

In the first through fifth embodiments, the method for reading data (charges) stored in two local charge portions in the complementary state (hereinafter, referred to as a "first method") has been described. The semiconductor memory devices in the first through fifth embodiments are preconditioned that data is stored in all the memory cells in the complementary state.

In the case where a semiconductor memory device is used in a conventional method of storing a charge independently in each of local charge portions therein (hereinafter, referred to as a "second method"), there is an advantage that a plurality of pieces of data can be stored in one memory cell although there are disadvantages in terms of reliability, speed of data read and the like.

When the first method and the second method are used in combination in accordance with the actual situation of usage, the memory area can be more efficiently used. Specifically, for example, when a high reliability is required, when a low voltage is required, and when a high speed read is required, the first method is used. When a large capacity is required, the second method is used. The semiconductor memory device in the sixth embodiment switches the data storage method in accordance with the actual situation of usage by using flag cells.

In FIG. 11, the flag cell F01 stores a flag bit (data 1) indicating that the data is written to the memory cells M01 through M06 connected to the word line WL0 using the first method. The flag cell F11 stores a flag bit (data 0) indicating that the data is written to the memory cells M11 through M16 connected to the word line WL1 using the second method. Since one flag cell is provided for each word line, the data storage method can be selected for each word line. In the case where it is sufficient to have a capability of selecting the data storage method for each sector or for each chip, one flag cell may be provided for each sector or for each chip.

Data is read as follows in the semiconductor memory device in the sixth embodiment. First, the flag bit in each flag cell is read and checked. When the flag bit is 1 indicating that the data is stored in the corresponding memory cells by the first method, the bias conditions described in one of the first through fifth embodiments are set and data is read. When the flag bit is 0 indicating that data is stored in the corresponding memory cells by the second method, data is read by the conventional method.

For example, the memory cell M11 connected to the word line WL1 stores data by the second method. For reading data (charge) stored in the right local charge portion 107 of the memory cell M11, data is read using the bit line BL0, the sense amplifier 109, and the reference cell R09 with the bias conditions shown in FIG. 11. For reading data (charge) stored in the right local charge portion 107 of the memory cell M01 connected to the word line WL0 and data (charge) stored in the left local charge portion 106 of the memory cell M02 also connected to the word line WL0, any one of the above-described methods according to the present invention is used.

Owing to the above-described feature, the semiconductor memory device in the sixth embodiment can switch the data storage method in accordance with the situation of usage, for example, whether a high reliability is required, whether a low voltage is required, or whether a high speed read is required. Thus, the memory area can be used more efficiently.

It may delay the access time to read a flag bit from the flag memory cell before reading data from the memory cells. However, the influence on the access time by the operation of reading a flag bit can be restricted to a negligible level by storing the data storage methods in a latch circuit or the like beforehand and selecting the method by a logical calculation thereof. In the case where the data storage method is switched for each sector for a higher efficiency, the increase in the chip area due to the latch circuit or the like can be minimized.

The flag cells F01 and F11 do not need to be MNOS memory cells, and may be other types of memory cells such as, for example, mask ROMs. It is desirable to use rewritable memory cells as the flag cells F01 and F11.

Seventh Embodiment

Figure 12:
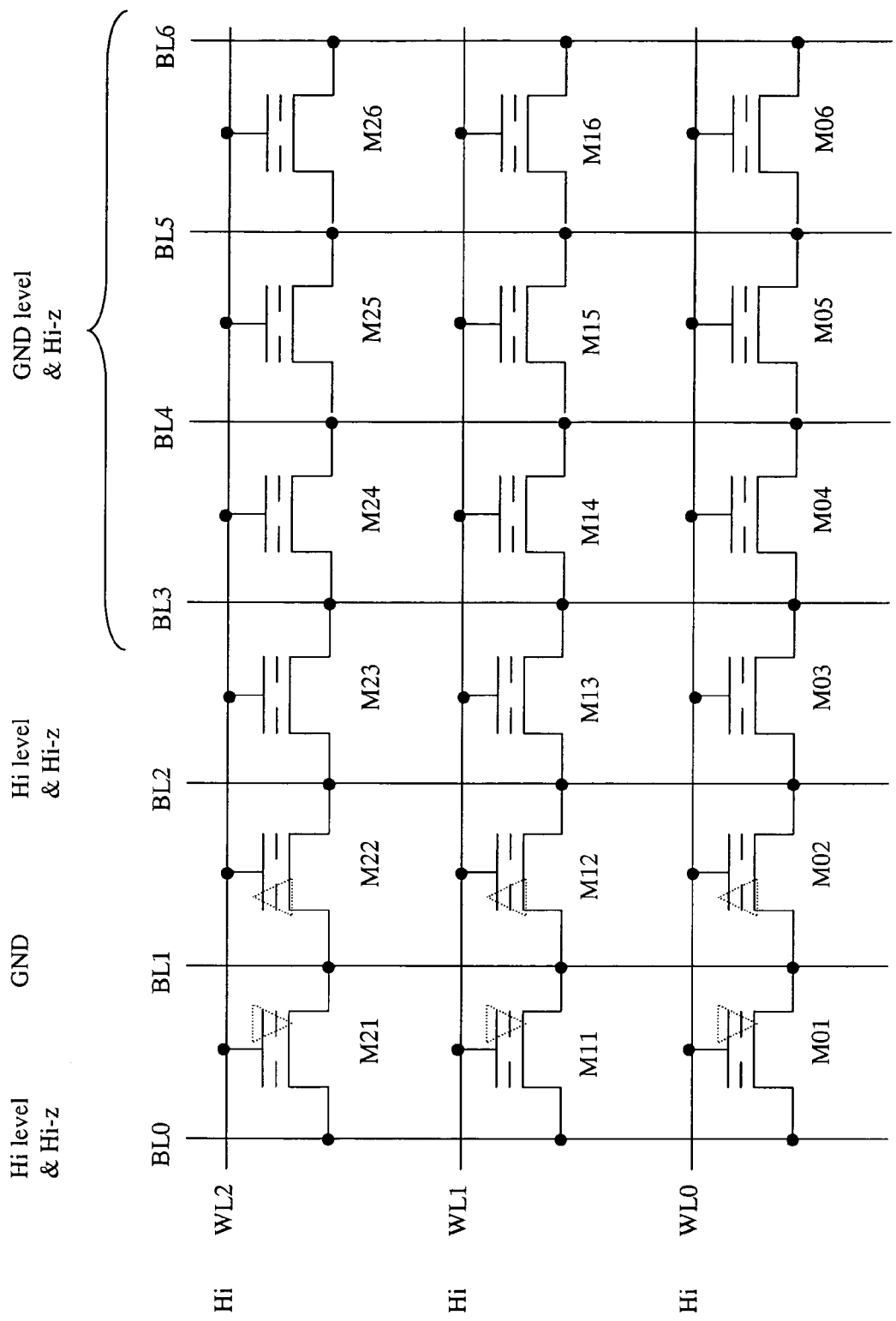
FIG. 12 is a schematic view of a memory array and a peripheral area thereof included in a semiconductor memory device according to a seventh embodiment of the present invention.
Figure 13B:
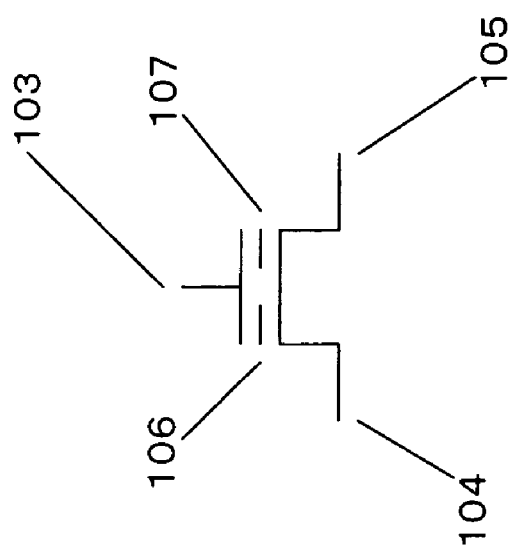
FIG. 13A and FIG. 13B are cross-sectional views of a general MNOS memory cell.
Figure 13A:
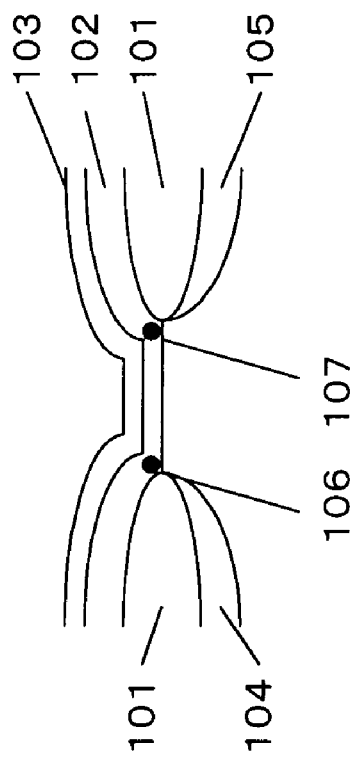

FIG. 12 is a schematic view of a memory array and a peripheral area thereof included in a semiconductor memory device according to a seventh embodiment of the present invention. The sense amplifier and the elements around the sense amplifier are omitted due to the shortage of space on the sheet of FIG. 12. FIG. 12 shows memory cells M11 through M16 and M21 through M26 and word lines WL1 and WL2 which are omitted from FIG. 2 which shows the semiconductor memory device in the first embodiment.

In the first through sixth embodiments, when the method for reading data (charges) stored in the complementary state (the first method) is used, one piece of data is stored using two local charge portions. The semiconductor memory device in the seventh embodiment can store one piece of data using three or more local charge portions in the complementary state.

For example, a pair 1 formed of the right local charge portion 107 of the memory cell M01 and the left local charge portion 106 of the memory cell M02, a pair 2 formed of the right local charge portion 107 of the memory cell M11 and the left local charge portion 106 of the memory cell M12, and a pair 3 formed of the right local charge portion 107 of the memory cell M21 and the left local charge portion 106 of the memory cell M22 store the same data. For reading the data, the potentials of the word lines WL0, WL1 and WL2 are concurrently raised to read the memory cell currents. The read memory cell currents are synthesized, and the sum of the memory cell current differences in the respective pairs is determined by the sense amplifier.

In the semiconductor memory device in the seventh embodiment having the above-described structure, the difference in the read currents which are input to the sense amplifier is large, and thus the operation can be performed at a higher speed. In addition, even if data stored in one of the pairs is lost for some reason, the other two pairs can compensate for the loss. Thus, the reliability is further improved.

Alternatively, the data stored in the three pairs of local charge portions may be sequentially read, and it may be determined whether the data is to be read on majority basis or not. The number of pairs of local charge portions storing the same data is not limited to three, and may be two or more than three.

The present invention is applicable to a wide range of devices using a nonvolatile semiconductor memory device, including memories for programming in mobile devices such as cellular phones and the like and memories for data storage in digital cameras and the like.

While the invention has been described in detail, the foregoing description is in all aspects illustrative and not restrictive. It is understood that numerous other modifications and variations can be devised without departing from the scope of the invention.

What is claimed is:

1. A nonvolatile semiconductor memory device capable of reading and erasing data and holding the data even while no voltage is supplied, the semiconductor memory device comprising:
   a plurality of memory cells each including a plurality of local charge portions each capable of storing a static charge corresponding to the data;
   wherein either two of the local charge portions store the charges in a complementary state.

2. A semiconductor memory device according to claim 1, wherein the two local charge portions are included in different memory cells.

3. A semiconductor memory device according to claim 1, wherein the two local charge portions are included in the same memory cell.

4. A semiconductor memory device according to claim 1, wherein the charges stored in the complementary state are read using different bit lines respectively connected to the local charge portions.

5. A semiconductor memory device according to claim 1, wherein the charges stored in the complementary state are read using a dummy bit line which is not connected to the local charge portions.

6. A semiconductor memory device according to claim 1, wherein the two local charge portions are included in different memory cells included in different memory arrays.

7. A semiconductor memory device according to claim 1, wherein the two local charge portions are included in different memory cells connected to different word lines.

8. A semiconductor memory device according to claim 1, further comprising capacitors connected to bit lines for reading the charges stored in the complementary state via a switch.

9. A semiconductor memory device according to claim 1, wherein the local charge portions are switchable into a state of storing charges independently.

10. A semiconductor memory device according to claim 9, wherein the local charge portions are switched based on a flag.

11. A semiconductor memory device according to claim 1, wherein one bit of data is stored using a plurality of pairs of the local charge portions, each pair being capable of storing the charges in the complementary state.

* * * * *